United States Patent
Hsu et al.

(10) Patent No.: US 7,271,448 B2
(45) Date of Patent: Sep. 18, 2007

(54) MULTIPLE GATE FIELD EFFECT TRANSISTOR STRUCTURE

(75) Inventors: Ju-Wang Hsu, Taipei (TW); Jyu-Horng Shieh, Hsin-Chu (TW); Hun-Jan Tao, Hsinchu (TW); Chang-Yun Chang, Taipei (TW); Zhong Tang Xuan, Kaohsiung (TW); Sheng-Da Liu, Hsinchu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 99 days.

(21) Appl. No.: 11/057,423

(22) Filed: Feb. 14, 2005

(65) Prior Publication Data

US 2006/0180854 A1   Aug. 17, 2006

(51) Int. Cl.
*H01L 29/94* (2006.01)
(52) U.S. Cl. .................. 257/365; 438/283; 438/284
(58) Field of Classification Search ............... 438/283, 438/284, 479; 257/347, 365
See application file for complete search history.

(56) References Cited

U.S. PATENT DOCUMENTS

| 6,562,665 | B1* | 5/2003 | Yu ........................... 438/149 |
| 7,037,851 | B2* | 5/2006 | Gueneau de Mussy et al. . 438/739 |
| 7,071,064 | B2* | 7/2006 | Doyle et al. ................. 438/283 |
| 2004/0169239 | A1* | 9/2004 | Rim ........................... 257/411 |
| 2005/0145932 | A1* | 7/2005 | Park et al. .................. 257/328 |
| 2005/0153486 | A1* | 7/2005 | Xiang et al. ................. 438/149 |

* cited by examiner

*Primary Examiner*—Trung Dang
(74) *Attorney, Agent, or Firm*—Tung & Associates

(57) ABSTRACT

A multiple gate region FET device for forming up to 6 FET devices and method for forming the same, the device including a multiple fin shaped structure comprising a semiconductor material disposed on a substrate; said multiple fin shaped structure comprising substantially parallel spaced apart sidewall portions, each of said sidewall portions comprising major inner and outer surfaces and an upper surface; wherein, each of said surfaces comprises a surface for forming an overlying field effect transistor (FET).

40 Claims, 7 Drawing Sheets

US 7,271,448 B2

MULTIPLE GATE FIELD EFFECT TRANSISTOR STRUCTURE

FIELD OF THE INVENTION

This invention generally relates to microelectronic integrated circuit (IC) semiconductor device fabrication and more particularly to a multiple gate Field Effect Transistors (FET's) including a multiple fin shaped FET structure having improved device speed and performance for forming advanced integrated circuit devices.

BACKGROUND OF THE INVENTION

With increasing demands for advanced device structures, the use of dopants to control the conducting channel in traditional CMOS devices is reaching its limits. As CMOS devices are scaled to the nanometer regime, SOI structures including fully depleted (FD) and partially depleted (PD) structures have provided an evolutionary pathway for MOSFETS operating at low power. CMOS designs below about 0.1 microns are plagued by shortcomings such as short channel effects (SCE) and gate oxide tunneling. In addition, sever restraints are placed on the uniformity of the active silicon channel region which is correspondingly reduced in dimension. One approach to overcome such shortcomings is to change the device structure such that the gate length may be scaled down while using thicker gate oxides and increased active silicon channel dimensions.

For example FET designs have included forming non-planar active silicon regions by forming fin-like silicon channel structures also referred to as finFETs and triple gated structures referred to a tri-gate FETs.

While these structures have been shown to have acceptable short channel behavior and may be formed with conventional gate oxide thicknesses to overcome gate oxide tunneling, majority carrier mobility is frequently compromised by prior art formation processes.

There is therefore a continuing need in the integrated circuit (IC) semiconductor device processing art to develop advanced CMOS FET devices including multiple gate regions.

It is therefore an object of the invention to provide an advanced CMOS FET device structure including multiple gate regions.

SUMMARY OF THE INVENTION

To achieve the foregoing and other objects, and in accordance with the purposes of the present invention, as embodied and broadly described herein, the present invention provides a multiple gate region field effect transistor (FET) device for forming up to 6 FET devices and method for forming the same.

In a first embodiment, the multiple gate region FET device includes a multiple fin shaped structure comprising a semiconductor material disposed on a substrate; said multiple fin shaped structure comprising substantially parallel spaced apart sidewall portions, each of said sidewall portions comprising major inner and outer surfaces and an upper surface; wherein, each of said surfaces comprises a surface for forming an overlying field effect transistor (FET).

In another embodiment, a method for forming the trough shaped structure comprising the multiple gate region FET device includes providing a semiconductor substrate; forming a second semiconductor material on the semiconductor substrate; forming an opening in the second semiconductor material to expose the semiconductor substrate at the opening bottom; lining the opening with a layer of the first semiconducting material; and, removing the second semiconductor material to leave the trough shaped structure.

These and other embodiments, aspects and features of the invention will be better understood from a detailed description of the preferred embodiments of the invention, which are further described below in conjunction with the accompanying Figures.

DETAILED DESCRIPTION OF THE PREFERRED EMBODIMENTS

The non-planar concave or multiple fin shaped gate region FET structure of the present invention may be used in a variety of circuits including high performance logic, low power logic, high density memory, and high density DRAMs. Moreover, the multiple gate region FET device of the present invention may readily be combined with other elements of analog, digital, as well as mixed signal circuits.

Figure 1A:
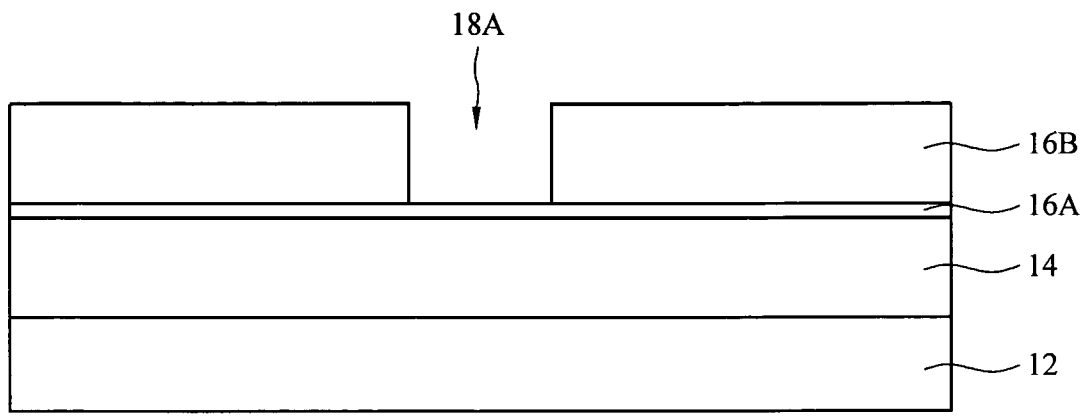
FIGS. 1A-1I are cross sectional views of an exemplary multiple gate region device at stages in manufacture according to embodiments of the present invention.

For example referring to FIG. 1A is shown a cross sectional view of an exemplary portion of a semiconductor substrate 12, for example a silicon semiconductor wafer. In one embodiment, an epitaxially grown semiconductor layer 14, preferably strained SiGe, is grown on the silicon substrate 12 by conventional epitaxial growth methods to a thickness of from about 300 Angstroms to about 1500 Angstroms. In another embodiment, shown below in FIGS. 2A-2E, the substrate may include an insulator layer (e.g., buried oxide) between semiconductor layers, e.g., silicon on insulator (SOI). An antireflective coating (ARC) layer 16A, preferably an inorganic material such as SiN, SiON, SiC, SiOC, or combinations thereof, also functioning as a hard mask, is preferably formed on the SiGe layer 14, followed by formation of a patterned photoresist layer (etching mask) having an opening 18A for etching a trench in the SiGe layer 14.

Figure 1B:
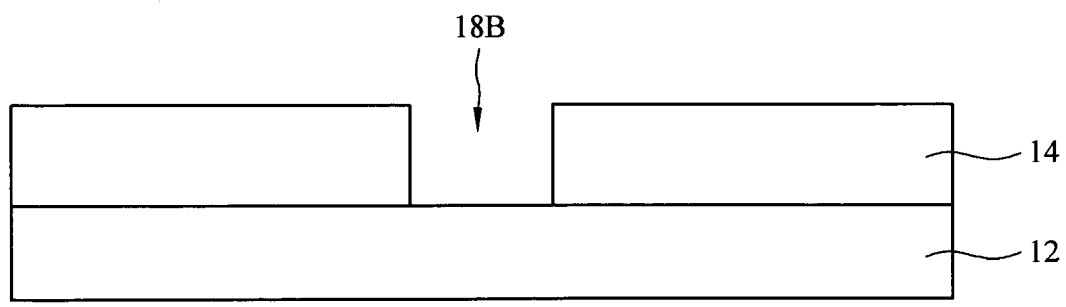

Referring to FIG. 1B, an opening 18B, exposing a portion of the semiconductor substrate 12 at the bottom portion of the opening 18B is then formed in the SiGe layer 14 by a conventional plasma (dry) etching process (e.g., reactive ion etch) to form the opening 18B followed by removal of the photoresist etching mask and the ARC hardmask. Preferably, the width of the opening 18B is formed having a width of from about 20 Angstroms to about 1500 Angstroms.

Figure 1C:
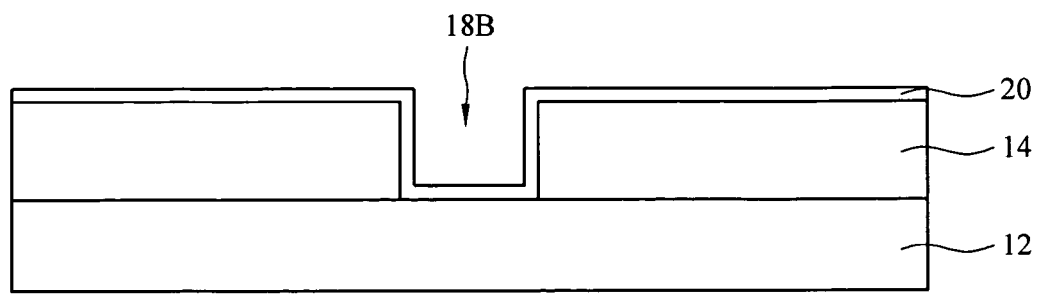

Referring to FIG. 1C, in an important aspect of the invention a conventional epitaxial growth process is then carried out to grow a layer of silicon 20 to a predetermined thickness. Advantageously, by epitaxially growing the silicon layer 20, the thickness of the silicon layer may be precisely controlled thereby improving the accuracy of the dimensions of the subsequently formed non-planar FET structure as shown below. The thickness of the epitaxially grown silicon layer 20 is preferably formed having a thickness of from about 10 Angstroms to about 200 Angstroms. Advantageously, the epitaxial layer lining the damascene opening as presented herein for forming the concave (trough shaped) FET structure of the present invention, may advantageously be formed with improved dimension tolerances across a wide range of dimensions compared to prior art processes.

Figure 1D:
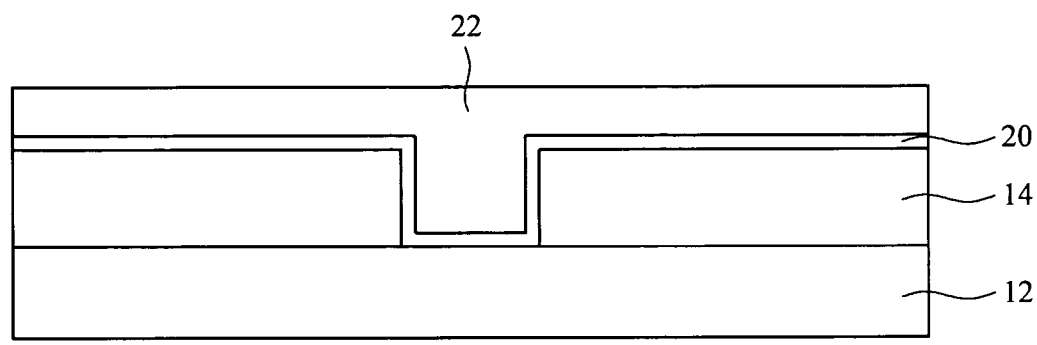

Referring to FIG. 1D, following formation of epi silicon layer 20, an organic or inorganic filling material layer 22 is formed over the process surface to include backfilling opening 18B and leaving a thickness portion overlying the SiGe layer 14. For example, the inorganic filling material may be silicon oxide e.g., formed by a CVD process and the organic filling material may be an organic polymeric (resinous) material formed by a spin-on method or a polymer forming plasma assisted deposition method. If the filling material layer 22 is an organic polymeric material, a thermal baking and/or ultraviolet light treatment is preferably performed following deposition to harden the organic material (induce polymer cross-linking) sufficient for a subsequent planarization process.

Figure 1E:
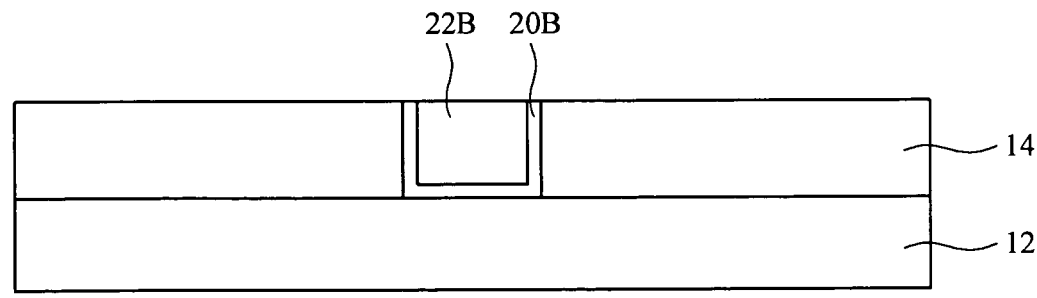

Referring to FIG. 1E, a planarization process, preferably a chemical mechanical polish (CMP) process, is then performed to remove surface portions of the filling material layer 22 as well as surface portions of the epi silicon layer 20 overlying the SiGe layer 14 to leave a concave or trough shaped epi silicon structure 20B filled with remaining filling material portion 22B.

Figure 1F:
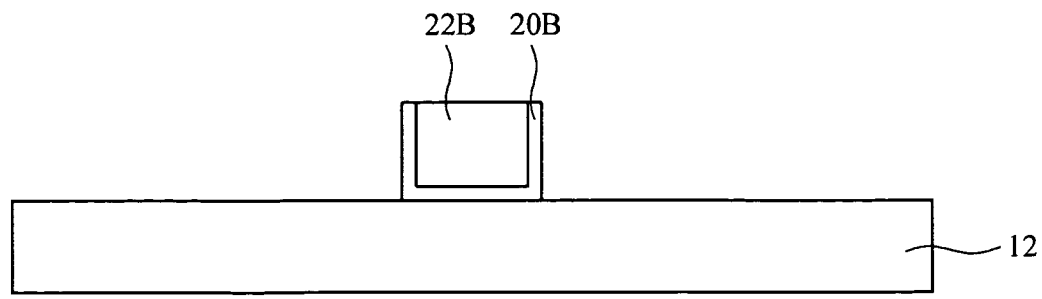

Referring to FIG. 1F, a wet or dry etching process, preferably a wet etching process, is then carried out to first selectively remove the remaining epi SiGe layer 14 portions to leave the concave (trough shaped) epi silicon structure 20B filled with filling material portion 22B.

Figure 1G:
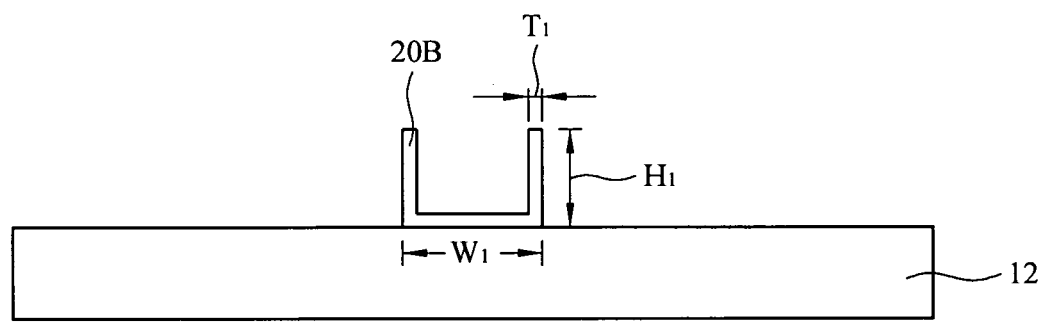

Referring to FIG. 1G, the filling material portion 22B is then removed by a conventional wet or dry etching (stripping) process, preferably a wet stripping process, to leave a free standing concave (trough shaped) epi silicon structure 20B having a width W1, of from about 20 Angstroms to about 1500 Angstroms, an epi silicon layer thickness T1 (fin width) of about 10 Angstroms to about 300 Angstroms, and a height H1 of about 300 Angstroms to about 1500 Angstroms. It will be appreciated that the epi silicon structure 20B forms channel regions of a non-planar multiple gate region FET device (multiple FET's) according to an embodiment of the present invention as shown below in FIG. 1I. It will also be appreciated that the epi silicon structure 20B is advantageously formed having a tensile (e.g., when formed over SiGe) or compressive strain to improve channel region charge carrier mobility as a result of having portions grown on a strained semiconductor substrate, e.g. SiGe layer 14.

Figure 1H:
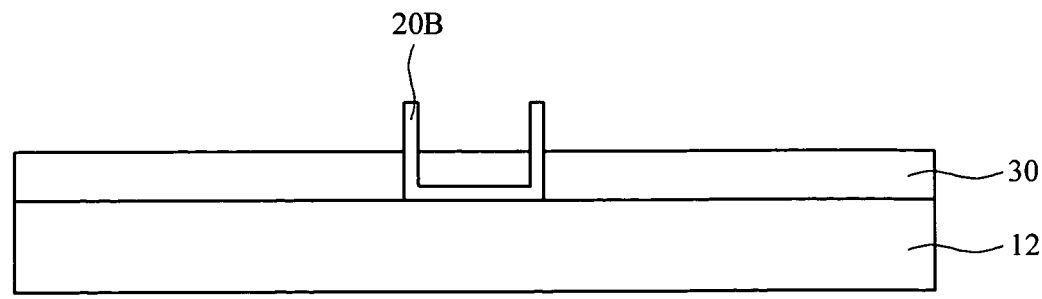

Referring to FIG. 1H, an electrical insulator layer 30 is then formed to partially fill "stuff" the epi silicon structure 20B to provide electrical isolation, for example where 4 to 6 FET's are subsequently formed on the epi silicon structure 20B. For example, a CVD deposited or spin on silicon oxide layer may be formed followed by an optional etchback process to expose fin (sidewall) portions of the epi silicon structure 20B.

Figure 1I:
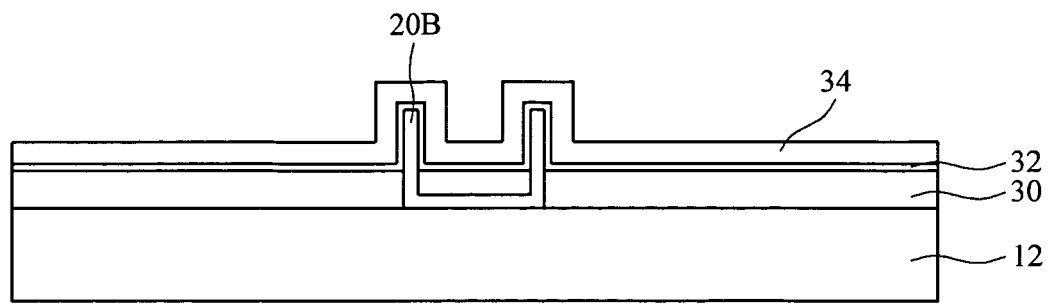

Referring to FIG. 1I, an exemplary embodiment of forming a multiple gate structure on the epi silicon structure 20B is shown in cross section including a contiguous gate electrode portion 34. A gate dielectric portion 32 is formed by conventional methods on the epi silicon structure 20B.

For example, the gate dielectric material may be formed of silicon dioxide, silicon nitride, nitrogen doped silicon oxide, high-K dielectrics, or combinations thereof. The high-K dielectrics may include metal oxides, metal silicates, metal nitrides, transition metal-oxides, transition metal silicates, metal aluminates, and transition metal nitrides, or combinations thereof.

The gate dielectric portion 32 may be formed by any process known in the art, e.g., thermal oxidation, nitridation, sputter deposition, or chemical vapor deposition. When using a high permittivity (high-K) gate dielectric, the dielectric constant is preferably greater than about 3.9. The high-K dielectric may be selected from a group including aluminum oxide ($Al_2O_3$), hafnium oxide ($HfO_2$), hafnium oxynitride (HfON), hafnium silicate ($HfSiO_4$), zirconium oxide ($ZrO_2$), zirconium oxynitride (ZrON), zirconium silicate ($ZrSiO_2$), yttrium oxide ($Y_2O_3$), lanthanum oxide ($La_2O_3$), cerium oxide ($CeO_2$), titanium oxide ($TiO_2$), tantalum oxide ($Ta_2O_5$), or combinations thereof.

A gate electrode portion 34 is then formed by conventional methods over the gate dielectric portion 32 to form a contiguous multiple gate structure. For example, a layer of the gate dielectric material 32 is first deposited followed by deposition of a gate electrode material 34; followed by conventional patterning and etching processes to form the multiple gate structure. The gate electrode 34 is preferably formed of a conductive material. The gate electrode 34 may include metal silicide portions electrically connected to other conductive electrical interconnect portions for applying an electrical potential to the multiple FET gate structure.

For example, the gate electrode 34 may be formed of conventional polysilicon, polysilicon-germanium, metals, metal silicides, metal nitrides, conductive metal oxides, or combinations thereof. In a preferred embodiment, the gate electrode 34 is formed of polysilicon. Metals or silicides thereof may be formed in an upper portion of the gate electrode 34 by a salicide formation process, for example including cobalt silicide or titanium silicided. Other exemplary metals and silicides thereof may include molybdenum, tungsten, tantalum, platinum, and hafnium. Metal nitrides may include, but are not limited to, molybdenum nitride, tungsten nitride, titanium nitride, and tantalum nitride. Conductive metal oxides may include, but are not limited to, ruthenium oxide and indium tin oxide.

Figure 3:
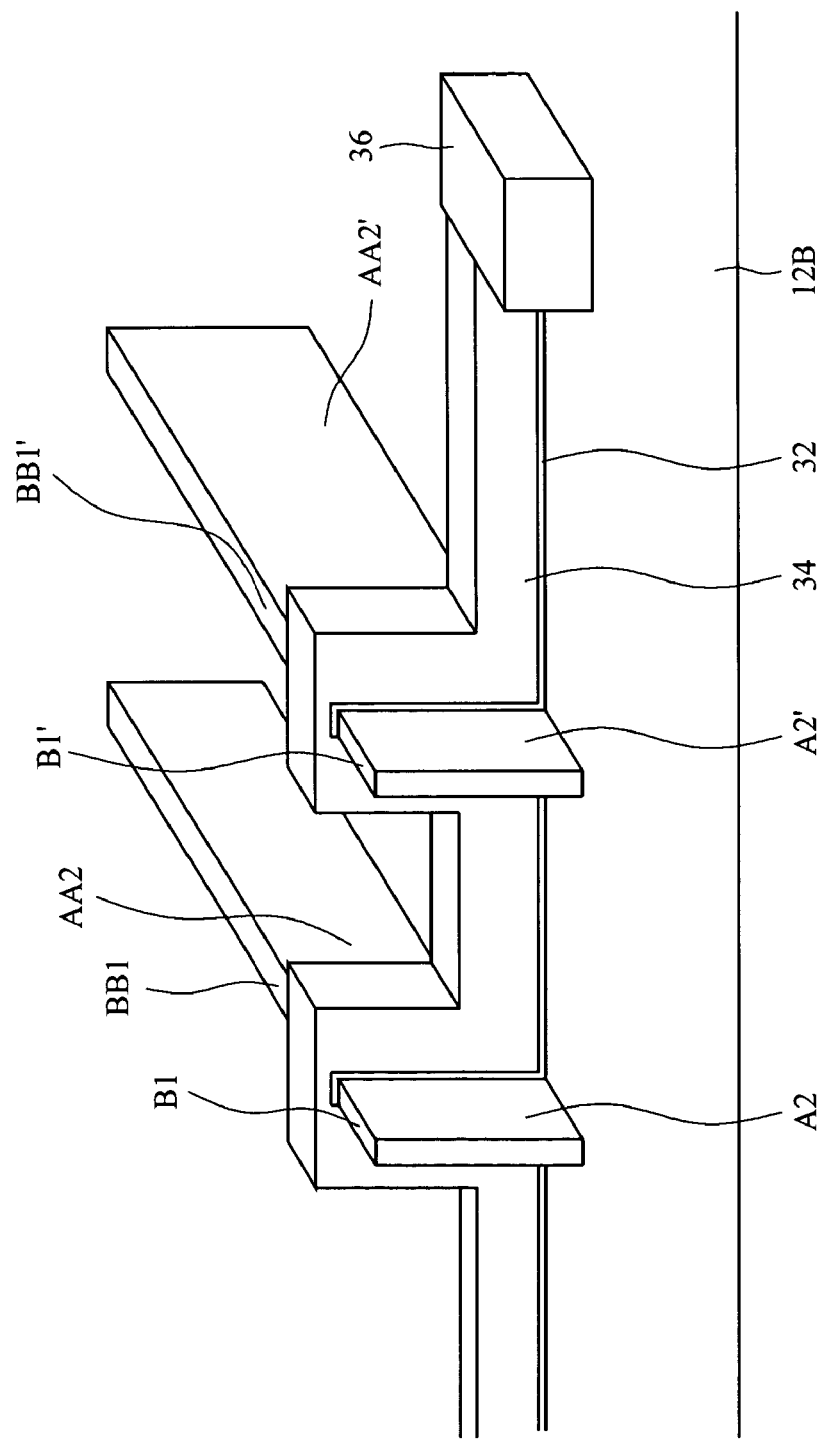
FIG. 3 is a 3-dimensional representation of an exemplary multiple gate region FET device according to an embodiment of the present invention.

It will be appreciated that each of six substantially planer surface portions of the sidewall portions of the epi silicon structure 20B protruding above the insulator layer 30 may form a separate FET gate structure (e.g., 4 to 6). For example, source and drain regions are formed on the semiconductor substrate adjacent either side the gate dielectric 32 and gate electrode 34 portions as shown in FIG. 3 below.

Figure 2A:
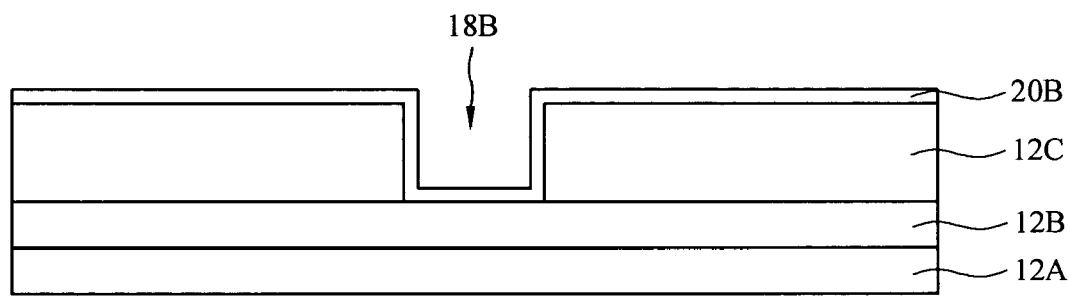
FIGS. 2A-2E are cross sectional views of a multiple gate region at stages in manufacture according to embodiments of the present invention.

Referring to FIG. 2A, in another embodiment, similar processes may be followed to produce a structure similar to that shown in FIG. 1C including opening 18B an epi layer (silicon) 20B according to the same preferred embodiments including s silicon semiconductor substrate 12 (e.g., Si wafer). In another embodiment, as shown, the substrate includes a lower silicon semiconductor portion 12A (e.g., Si wafer), a buried oxide layer 12B, and an epitaxially grown silicon layer 12C. In this embodiment, the semiconductor layer 20B is formed of epitaxially grown SiGe on the silicon layer 12C.

Figure 2B:
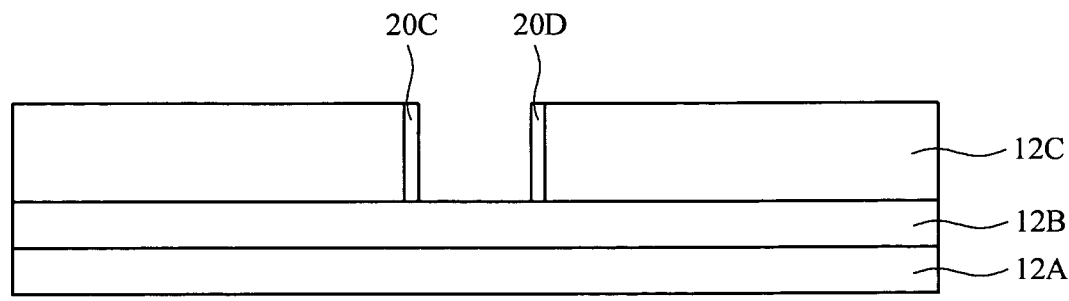

Referring to FIG. 2B, instead of filling the opening 18B with filling material as shown in the first embodiment, an anisotropic etching process, preferably a dry etching process, is carried out to selectively remove a bottom portion of the epi semiconductor layer 20B over the bottom portion of opening 18B to expose the underlying substrate e.g., 12B. At the same time, the portion of epi semiconductor layer 20B overlying the process surface is removed to leave sidewall epi semiconductor portions 20C and 20D.

Figure 2C:
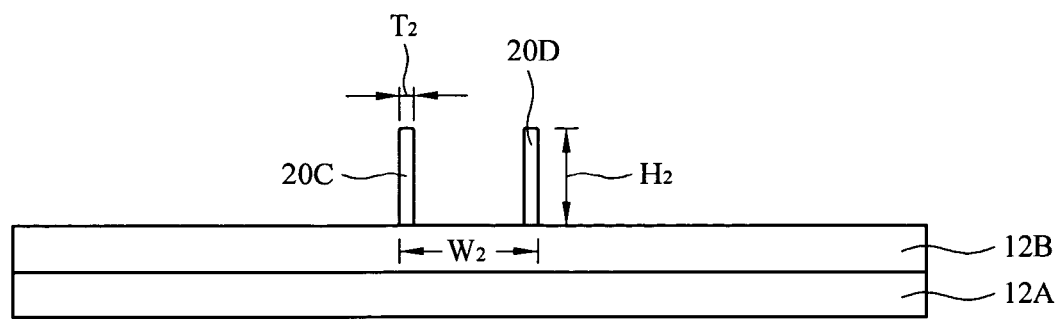

Referring to FIG. 2C, the remaining semiconductor layer portions e.g., 12C, adjacent the sidewall epi semiconductor structures 20C and 20D, are then removed, preferably according to a wet etching process, to leave free-standing sidewall epi semiconductor structures 20C and 20D. The semiconductor structures 20C and 20D have the same preferred dimensions as previously shown in FIG. 1G e.g., a thickness T2 (fin width) of about 10 Angstroms to about 200 Angstroms; a fin height H2 of about 300 Angstroms to about 1500 Angstroms; and, a width (fin spacing) W2 of about 300 Angstroms to about 1500 Angstroms.

Figure 2D:
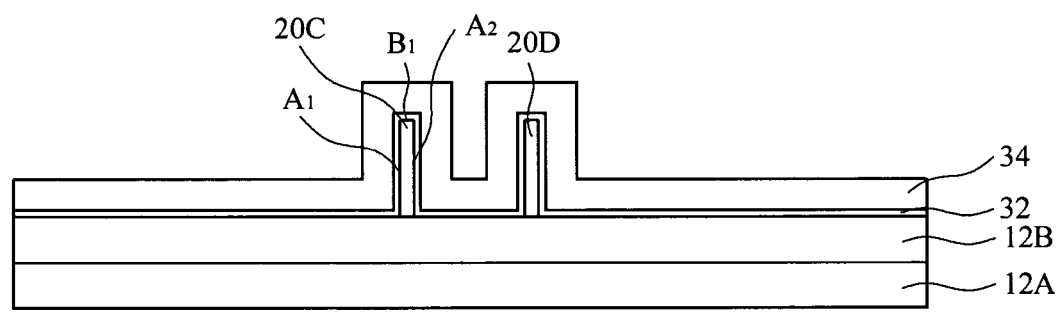

Referring to FIG. 2D, is shown an exemplary embodiment of a multiple FET device gate structure including gate electrode portion 34 and gate dielectric portion 32. The substrate on which the epi semiconductor (e.g., SiGe) sidewall (fin) portions 20C and 20D rest may be an insulator material e.g., 12B separating the sidewall portions e.g., forming the bottom portion. As such, an insulator dielectric "stuffing" between sidewall portions (fins) as shown above in FIG. 1H and below in FIG. 2E, need not be formed to provide electrical isolation between the sidewall (fin) portions 20C and 20D. The gate dielectric 32 and gate electrode portions 34 may be formed as previously outlined to form from 4 to 6 FET's on the two sidewall (fin) portions 20C and 20D.

Still referring to FIG. 2D, the sidewall (fin) portions 20C and 20D provide up to 6 surfaces for forming FET devices where the gate regions for each of the FET devices may be formed on sidewall portion upper surfaces, e.g., B1, and on sidewall major surfaces e.g., A1, A2.

It will be appreciated each of the sidewall portions 20C and 20D provides a semiconductor substrate including a channel region for forming up to 3 FET devices, for a total of up to 6 FET devices.

Figure 2E:
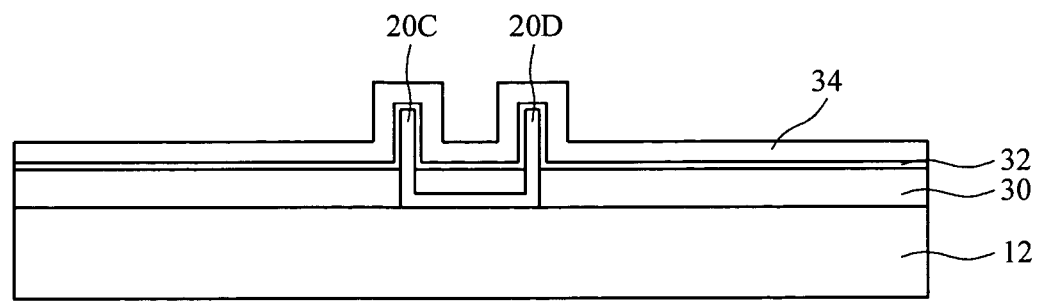

Referring to FIG. 2E, where the substrate is a silicon substrate e.g., 12, for example, where the epi semiconductor sidewall (fin) portions 20C and 20D are formed of epi Si, an insulator dielectric layer 30 is preferably formed to electrically isolate the sidewall (fin) portions as previously shown in FIG. 1H prior to forming the gate dielectric 32 and gate electrode portions 34.

Referring to FIG. 3 is shown an exemplary 3-dimension representation of a portion of a multiple gate region FET device formed by sidewall (fin) epi semiconductor portions e.g., 20C and 20D. For example the sidewall major surfaces of the sidewall epi semiconductor structures e.g., A2 and A2', as well as opposite facing sides (not labeled for clarity), may be used to form source/drain regions adjacent either side of gate dielectric 32 and gate electrode 34 portions to form 4 FET devices. In addition, uppermost surface portions e.g., B1 and B1' may be used to form source/drain regions for an additional FET device. It will be appreciated that corresponding source/drain, e.g. drain regions are formed on symmetrically adjacent surface portions of the sidewall (fin) portions, e.g., AA2, AA2', BB1, and BB1', to form each FET device. Thus, the number of gate regions (FET devices) that may be formed may be advantageously adjusted from 4 to 6. Also shown is a portion of an electrode electrical interconnect 36 for applying an electrical signal (voltage potential) to the gate electrode portion 34. Thus, according to the present invention, multiple gate regions and associated source and drain regions forming multiple FET's, preferably from 4 to 6 FET devices, may be formed on the sidewall (fin) epi semiconductor structures 20C and 20D.

It will be appreciated by those skilled in the art that charge carrier mobility may be optimized for a particular polarity of conductivity, e.g., NMOS and PMOS devices, in an epitaxial silicon or SiGe portion forming a gate channel region where the substrate is formed with preferred crystal orientations and/or a selected tensile or compressive strain. For example, selection of an appropriate substrate e.g., 12 orientation results in the formation of preferred channel (crystal) direction and surface orientation of the overlying epitaxial semiconductor structures e.g., 20B, or 20C and 20D. It will be appreciated that the epi semiconductor structures e.g., 20B, or 20C and 20D, may be formed with each having a selected strain, for example a tensile strain, preferably for NMOS devices or a compressive strain, preferably for PMOS devices to enhance electron charge carrier mobility and device performance.

Thus, a multiple gate region FET structure and method for forming the same has been presented. Advantageously, the number of gate regions may be varied between 4 and 6 gates to form multiple FET's on fin shaped semiconductor structures. Advantageously, both NMOS and PMOS devices may be formed on the fin shaped semiconductor structures. As a result, higher density and higher speed FET semiconductor devices may be formed having improved device performance.

Figure 4:
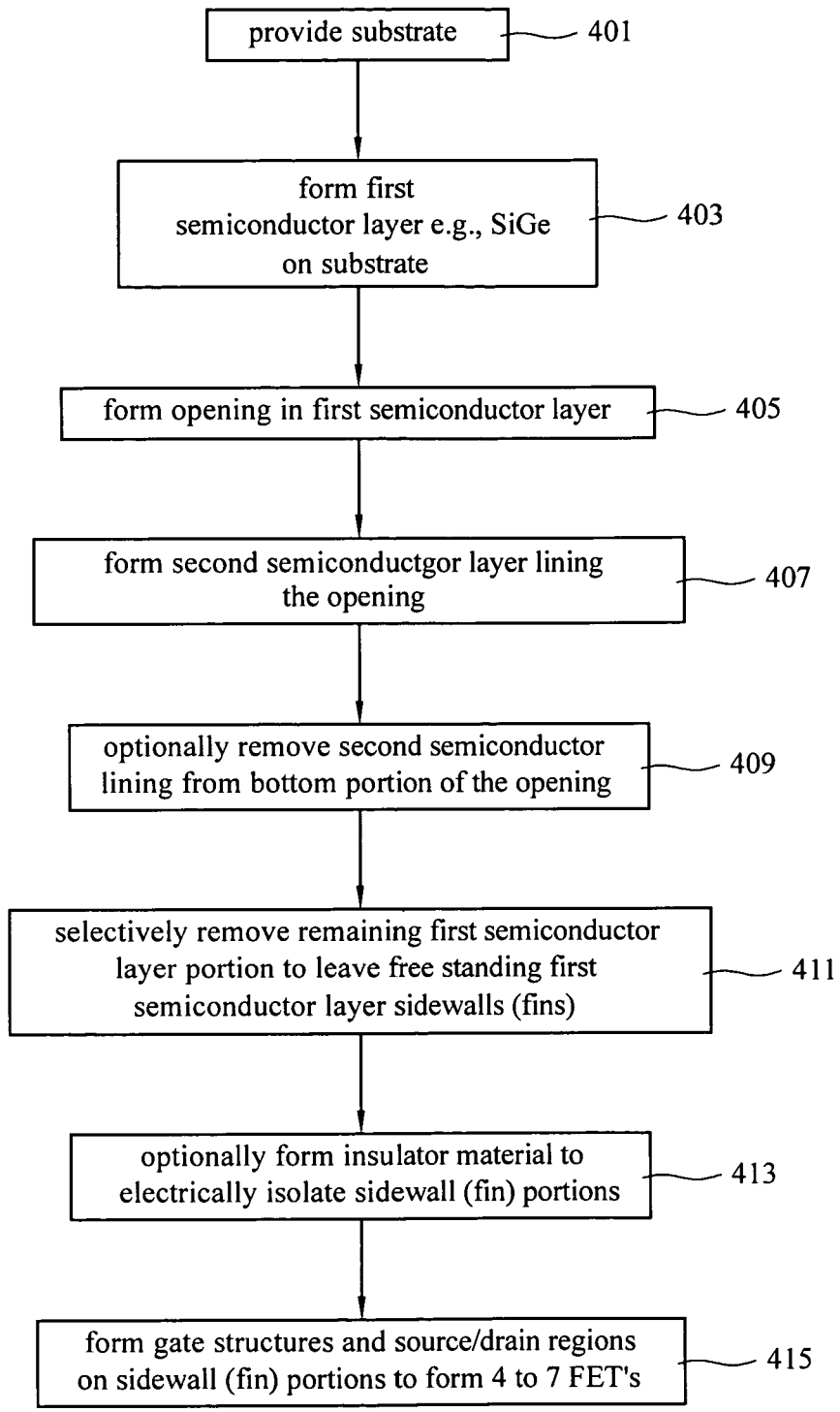
FIG. 4 is a process flow diagram including several embodiments of the present invention.

Referring to FIG. 4 is shown a process flow diagram including several embodiments of the present invention. In process 401 a substrate is provided. In process 403, a first semiconductor layer is formed on the substrate. In process 405, an opening is formed in the first semiconductor layer. In process 407, a second semiconductor layer is formed to line the sidewalls of the opening. In process 409, the second semiconductor layer is optionally removed from a bottom portion of the opening. In process 411, a remaining portion of the first semiconductor layer is selectively removed to leave free standing second semiconductor layer portions including sidewall (fin) portions. In process 413, an insulator layer is optionally formed to fill a space between the sidewall (fin) portions to provide electrical isolation. In process 415, gate structures and source/drain regions are formed on the epi semiconductor fin portions to form 4 to 6 FET's.

The preferred embodiments, aspects, and features of the invention having been described, it will be apparent to those skilled in the art that numerous variations, modifications, and substitutions may be made without departing from the spirit of the invention as disclosed and further claimed below.

What is claimed is:

1. A multiple gate region FET device comprising:
   a multiple fin having a concave upward U-shaped structure comprising an epitaxial semiconductor material deposited on a substrate;
   said multiple fin shaped structure comprising substantially parallel spaced apart sidewall portions, each of said sidewall portions comprising major inner and outer surfaces and an upper surface;
   wherein, each of said surfaces comprises a surface for forming an overlying field effect transistor (FET);
   an insulator solid material separating the sidewall portions; and,
   a contiguous gate structure comprising a lowermost gate dielectric and an overlying gate electrode formed on the sidewall surfaces and said insulator material to form said multiple field effect (FET) transistors.

2. The multiple gate region FET device of claim 1, wherein the sidewall portions are spaced apart by a distance of about 20 Angstroms to about 1500 angstroms.

3. The multiple gate region FET device of claim 1, wherein the sidewall portions have a thickness of from about 10 Angstroms to about 300 Angstroms.

4. The multiple gate region FET device of claim 1, wherein the sidewall portions have a height above the semiconductor substrate surface of from about 300 Angstroms to about 1500 Angstroms.

5. The multiple gate region FET device of claim 1, wherein the sidewall portions further comprise a contiguous bottom portion formed of the semiconductor material.

6. The multiple gate region FET device of claim 1, wherein the sidewall portions are separated by said insulator solid material disposed on said substrate.

7. The multiple gate region FET device of claim 1, wherein the semiconductor material is selected from the group consisting of silicon, SiGe, strained semiconductor, and combinations thereof.

8. The multiple gate region FET device of claim 1, wherein the semiconductor material is selected from the group consisting of epitaxially grown silicon and epitaxially grown SiGe.

9. The multiple gate region FET device of claim 1, wherein the sidewall portions comprise a strain selected from the group consisting of a tensile strain and a compressive strain.

10. The multiple gate region FET device of claim 1, wherein the gate dielectric comprises a material selected from the group consisting of silicon dioxide, silicon nitride, nitrogen doped silicon oxide, high-K dielectrics, and combinations thereof.

11. The multiple gate region FET device of claim 1, wherein the gate electrode comprises a material selected from the group consisting of polysilicon, polysilicon-germanium, metals, metal silicided, conductive metal nitrides, conductive metal oxides, and combinations thereof.

12. The multiple gate region FET device of claim 1, wherein the sidewall portions further comprise respective source and drain regions adjacent said contiguous gate structure to form up to 6 FET's.

13. The multiple gate region FET device of claim 12, wherein the source and drain regions comprise 4 to 6 FET's.

14. A multiple gate region FET device comprising:
an epitaxial semiconductor structure defining a concave upward U-shaped structure deposited on a semiconductor substrate said concave upward U-shaped structure defined by two spaced apart sidewall portions;
each of said sidewall portions comprising sidewall surfaces comprising a major inner and outer surface and an upper surface to define six substantially planar surfaces;
an insulator solid material on the bottom of the concave upward U-shaped structure separating the sidewall portions; and,
a contiguous gate structure comprising a lowermost gate dielectric and an overlying gate electrode formed on the sidewall surfaces and said insulator solid material to form multiple field effect (FET) transistors.

15. The multiple gate region FET device of claim 14, further comprising source and drain regions disposed on respective sidewall portion surfaces adjacent said contiguous gate structure to form up to 6 FET gate structures.

16. The multiple gate region FET device of claim 15, wherein the source and drain regions are disposed to form 4 to 6 FET gate structures.

17. A method of forming a multiple gate region FET device comprising the steps of:
epitaxially forming a multiple fin shaped structure comprising a semiconductor material deposited on a substrate;
said multiple fin having a concave upward U-shaped structure comprising substantially parallel spaced apart sidewall portions, each of said sidewall portions comprising major inner and outer surfaces and an upper surface;
wherein, each of said surfaces comprises a surface for forming an overlying field effect transistor (FET);
wherein an insulator solid material separates the sidewall portions; and,
forming a contiguous gate structure comprising a lowermost gate dielectric and an overlying gate electrode formed on the sidewall surfaces and on said insulator solid material to form said multiple field effect (FET) transistors.

18. The method of claim 17, wherein the sidewall portions are spaced apart by a distance of about 20 Angstroms to about 1500 angstroms.

19. The method of claim 17, wherein the sidewall portions have a thickness of from about 10 Angstroms to about 300 Angstroms.

20. The method of claim 17, wherein the sidewall portions have a height above the semiconductor substrate surface of from about 300 Angstroms to about 1500 Angstroms.

21. The method of claim 17, wherein the sidewall portions further comprise a contiguous bottom portion formed of the semiconductor material.

22. The method of claim 17, wherein the sidewall portions are separated by said insulator solid material formed on said substrate.

23. The method of claim 17, wherein the semiconductor material is selected from the group consisting of silicon, SiGe, strained semiconductor, and combinations thereof.

24. The method of claim 17, wherein the semiconductor material is selected from the group consisting of epitaxially grown silicon and epitaxially grown SiGe.

25. The method of claim 17, wherein the sidewall portions comprise a strain selected from the group consisting of a tensile strain and a compressive strain.

26. The method of claim 17, wherein the gate dielectric comprises a material selected from the group consisting of silicon dioxide, silicon nitride, nitrogen doped silicon oxide, high-K dielectrics, and combinations thereof.

27. The method of claim 17, wherein the gate electrode comprises a material selected from the group consisting of polysilicon, polysilicon-germanium, metals, metal silicided, conductive metal nitrides, conductive metal oxides, and combinations thereof.

28. The method of claim 17, wherein the sidewall portions further comprise respective source and drain regions adjacent said contiguous gate structure to form up to 6 FET's.

29. The method of claim 28, wherein the source and drain regions comprise 4 to 6 FET's.

30. A method of forming a multiple gate region FET device comprising the steps of:
epitaxially forming a semiconductor structure defining a concave upward U-shaped structure deposited on a semiconductor a substrate said concave upward U-shaped structure defined by two spaced apart sidewall portions;

each of said sidewall portions comprising sidewall surfaces comprising a major inner and outer surface and an upper surface to define six substantially planar surfaces;

forming an insulator solid material on the bottom of the concave upward U-shaped structure separating the sidewall portions; and, forming a contiguous gate structure comprising a lowermost gate dielectric and an overlying gate electrode formed on the sidewall surfaces and on said solid insulator material to form multiple field effect (FET) transistors.

31. The method of claim 30, wherein the step of forming a semiconductor structure comprises the steps of:

providing a substrate;

forming a first semiconductor material on the substrate;

forming an opening in the semiconductor material to expose the substrate at the opening bottom;

lining the opening with a layer of a second semiconductor material; and, removing the first semiconductor material to leave the second semiconductor material comprising the spaced apart sidewall portions.

32. The method of claim 31, further comprising the step of removing the second semiconducting material at the opening bottom following the step of lining and before the step of removing.

33. The method of claim 31, further comprising the step of forming source and drain regions to form up to 6 FET's.

34. The method of claim 33, wherein the source and drain regions are formed to comprise 4 to 6 FET's.

35. The method of claim 31, wherein the first semiconductor material comprises silicon and the second semiconductor material comprises silicon-germanium.

36. The method of claim 31, wherein the first semiconductor material comprises silicon-germanium and the second semiconductor material comprises silicon.

37. The method of claim 31, wherein the substrate is selected from the group consisting of a semiconductor and an insulator.

38. The method of claim 30, wherein said insulator material is formed by forming said solid insulator material over said sidewall portions and removing a portion to expose an upper portion of said sidewall portions.

39. The method of claim 17, wherein the step of forming a multiple fin having a concave upward U shaped structure comprises the steps of:

providing a substrate;

forming a first semiconductor material on the substrate;

forming an opening in the semiconductor material to expose the substrate at the opening bottom;

lining the opening with a layer of a second semiconductor material; and, removing the first semiconductor material to leave the second semiconductor material comprising the spaced apart sidewall portions.

40. The method of claim 39, further comprising the step of removing the second semiconducting material at the opening bottom following the step of lining and before the step of removing.

* * * * *